United States Patent [19]

Nishioka

[11] Patent Number: 5,567,568
[45] Date of Patent: Oct. 22, 1996

[54] PHOTOSENSITIVE COMPOSITION AND PHOTOSENSITIVE LITHOGRAPHIC PRINTING PLATE

[75] Inventor: Akira Nishioka, Shizuoka, Japan

[73] Assignee: Fuji Photo Film Co., Ltd., Kanagawa, Japan

[21] Appl. No.: 357,305

[22] Filed: Dec. 14, 1994

[30] Foreign Application Priority Data

Dec. 14, 1993 [JP] Japan .................. 5-313589

[51] Int. Cl.$^6$ ............... G03F 7/11; G03F 7/021; G03F 7/031
[52] U.S. Cl. ............... 430/162; 430/175; 430/176; 430/273.1; 430/281.1; 430/283.1; 430/284.1; 430/288.1; 430/302; 430/920; 430/925
[58] Field of Search ............... 430/175, 281.1, 430/288.1, 176, 162, 273.1, 302, 916, 283.1, 284.1, 920, 925

[56] References Cited

U.S. PATENT DOCUMENTS

| | | |
|---|---|---|
| 4,687,727 | 8/1987 | Toyama et al. ............ 430/162 |
| 4,826,753 | 5/1989 | Higashi et al. ............ 430/175 |
| 4,946,373 | 8/1990 | Walls et al. ............ 430/288 |
| 5,080,999 | 1/1992 | Imai et al. ............ 430/175 |
| 5,112,743 | 5/1992 | Kamiya et al. ............ 430/176 |
| 5,153,095 | 10/1992 | Kawamura et al. ............ 430/281 |

*Primary Examiner*—John S. Y. Chu
*Attorney, Agent, or Firm*—Sughrue, Mion, Zinn, Macpeak & Seas

[57] ABSTRACT

A photosensitive composition comprising (A) an ethylenically unsaturated addition-polymerizable compound, (B) an aqueous alkali-soluble or swelling polymer which is capable of forming a film, (C) a photopolymerization initiator, (D) a negative-working diazo resin, and (E) a component which is soluble in a photosensitive solution, but floats on a surface of a photosensitive layer and is capable of forming an oxygen-intercepting layer during coating and drying is described. A photosensitive lithographic printing plate comprising a support coated with the above-described photosensitive composition and a matting layer provided thereon, wherein the surface of the matting layer has a micro pattern comprising (i) a portion which is coated with a composition comprising a copolymer containing at least one monomer unit having a sulfonic acid group and (ii) a portion which is uncoated with the composition is also descried.

9 Claims, No Drawings

PHOTOSENSITIVE COMPOSITION AND PHOTOSENSITIVE LITHOGRAPHIC PRINTING PLATE

FIELD OF THE INVENTION

This invention relates to a photosensitive composition suitable for a photosensitive lithographic printing plate, and a photosensitive lithographic printing plate, and more particularly, to a novel photosensitive composition and a photosensitive lithographic printing plate which can reduce influence of oxygen in plate making without forming an oxygen-intercepting layer as a different layer.

BACKGROUND OF THE INVENTION

Attempts to use a photopolymerizable composition as an image-forming layer suitable for a photosensitive lithographic printing plate have been made for years. For example, the fundamental composition comprising an organic solvent-soluble polymer, an ethylenically unsaturated addition-polymerizable compound and a photopolymerization initiator described in JP-B-46-32714 (the term "JP-B" as used herein means an "examined Japanese patent publication"), the composition having an improved curing efficiency by introducing an unsaturated double bond into an organic solvent-soluble polymer described in JP-B-49-34041, and the composition including a novel photopolymerization initiator described in JP-B-48-38403, JP-B-53-27605 and British Patent 1,388,492 have been known. Some of these examples have been in practical use.

However, any of the photosensitive compositions used as a photosensitive layer of a lithographic printing plate suffers from polymerization inhibition owing to oxygen remarkably during image exposure, and therefore those photosensitive compositions have not been able to be practically used without providing an oxygen-intercepting layer comprising a water-soluble resin on the surface of the photosensitive layer. However, formation of the oxygen-intercepting layer results in high manufacturing cost and in deteriorated properties of the lithographic printing plate.

Thus, techniques for avoiding the influence of oxygen without providing the oxygen-intercepting layer comprising a water-soluble resin have been desired. As attempts to reduce the polymerization inhibition due to the influence of oxygen, behenic acid or wax is added to the above-mentioned photosensitive composition as an agent for forming an oxygen-intercepting layer, or a negative-working diazo resin is added thereto which is not so much affected by oxygen. Such attempts are described in, for example, JP-A-49-99790 (the term "JP-A" as used herein means an "unexamined published Japanese patent application"), JP-A-54-95687, JP-A-59-206825, JP-A-59-53836, JP-A-59-178449, JP-A-57-196230, JP-A-63-63031, JP-A-63-206742 and U.S. Pat. No. 4,316,949. However, since any of these attempts has no effect sufficient for reducing the bad influence of oxygen, the lithographic printing plates obtained are affected by the degree of vacuum printing frame of an exposure machine in plate making, causing the properties (for example, sensitivity and impression capacity) of the lithographic printing plates to become unstable.

On the other hand, when images are formed on the surface of the photosensitive printing plate, a film original plate is generally superposed upon the photosensitive printing plate, which is exposed to light through the film original plate. At that time, in order to form more clear images, it is necessary to bring the photosensitive layer of the photosensitive printing plate into completely contact with the film original plate superposed to prevent the lack of sharpness in exposed images caused by the space between the both plates. In general, therefore, adhesion of the both plates is conducted by use of a vacuum printing frame (vacuum contact method), in which the photosensitive printing plate and the film original plate are placed between a glass sheet and a rubber sheet of the printing frame, and a gap between the glass sheet and the rubber sheet is evacuated, thereby bringing the both plates in close contact with each other. However, when the surface of the photosensitive printing plate is smooth, marginal parts of the both plates often adhere to each other at the beginning of evacuation to prevent central parts thereof from being thereafter evacuated. Accordingly, it takes a long time to contact closely the whole surface of the photosensitive printing plate with the film original plate, which uneconomically reduces the working efficiency of the plate making.

For the purpose of shortening the time required for the vacuum contact, in positive type photosensitive lithographic printing plates using o-quinonediazide and negative type photosensitive lithographic printing plates using a negative-type diazo resin, photosensitive printing plates containing a matting layer having a micro pattern in which coated portions removable on developing and non-coated portions are present in a mixed state, and processes for producing them have been developed and practically used, as described in JP-A-51-111102, JP-A-57-34558 (corresponding to U.S. Pat. No. 4,626,484) and JP-A-58-182636 (corresponding to U.S. Pat. No. 4,557,994).

However, the photosensitive lithographic printing plate prepared from the photosensitive composition to which behenic acid or wax is added as an agent for forming the oxygen-intercepting layer have disadvantage that the oxygen-intercepting layer reduces the adhesion of the matting layer, or the matting layer destroys the oxygen-intercepting layer, resulting in unstable properties (for example, sensitivity and impression capacity) of the lithographic printing plates.

SUMMARY OF THE INVENTION

An object of the present invention is therefore to provide a novel photosensitive composition and a novel photosensitive lithographic printing plate which are improved in the above-mentioned disadvantage (bad influence of oxygen during exposure) and further offer high impression capacity in the photosensitive lithographic printing plate.

Moreover, another object of the present invention is to provide a novel photosensitive composition and a novel photosensitive lithographic printing plate in which an oxygen-intercepting layer has no bad influence on adhesion of a matting layer comprising coated portions and non-coated portions and the matting layer does not destroy the oxygen-intercepting layer.

The present inventors have discovered that a photosensitive composition is not substantially affected by oxygen and a high impression capacity can be obtained in a photosensitive lithographic printing plate without forming an oxygen-intercepting layer comprising a water-soluble resin as another layer, by using a composition containing a negative-working diazo resin in combination with a compound specifically selected as component (E) described below (a component which is dissolved in a photosensitive solution, but floats on a surface of a photosensitive layer and is capable of forming an oxygen-intercepting layer in coating and drying), and that the adhesion of the matting layer is not affected when the matting layer is formed and further the oxygen-intercepting layer is not destructed by the matting layer. Thus, the present invention has been completed.

Further, the present inventors have discovered that a reduction in the adhesion of the matting layer owing to the oxygen-intercepting layer and the destruction of the oxygen-intercepting layer owing to the matting layer do not take place, and the bad influence of oxygen can be avoided in addition to shortening of the time required for evacuation and prevention of the lack of sharpness, by forming a layer comprising a micro pattern in which portions coated with a copolymer containing a sulfonic acid group-containing monomer and portions non-coated therewith are present in a mixed state as the matting layer on a surface of a layer formed by coating the above-mentioned photosensitive composition of the present invention.

These and other objects of the present invention have been achieved by a photosensitive composition comprising (A) an ethylenically unsaturated addition-polymerizable compound, (B) an aqueous alkali-soluble or swelling polymer which is capable of forming a film, (C) a photopolymerization initiator, (D) a negative-working diazo resin, and (E) a component which is soluble in a photosensitive solution, but floats on a surface of a photosensitive layer and is capable of forming an oxygen-intercepting layer during coating and drying, wherein the component (E) comprises a compound represented by the following formula (I) and a compound represented by the following formula (II-a), (II-b) or (II-c):

| | |
|---|---|
| $R^1C(=O)N(R^2)(R^3)$ | (I) |
| $R^4C(=O)OH$ | (II-a) |
| $R^4CH_2OH$ | (II-b) |
| $R^4C(=O)NH_2$ | (II-c) | wherein $R^1$ represents an alkyl group having from 15 to 25 carbon atoms; $R^2$ represents —H, —$CH_3$, —$C_2H_5$ or —$C_3H_7$; $R^3$ represents —$CH_3$, —$C_2H_5$ or —$C_3H_7$; and $R^4$ represents an alkyl group having from 15 to 25 carbon atoms.

Further, these and other object of the present invention have been achieved by the photosensitive composition in which the photopolymerization initiator (C) is a photosensitive S-triazine compound having a particular substituent.

Furthermore, these and other objects of the present invention have been achieved by a photosensitive lithographic printing plate comprising a support coated with the above-described photosensitive composition and a matting layer provided thereon, wherein the surface of the matting layer has a micro pattern comprising (i) a portion which is coated with a composition comprising a copolymer containing at least one monomer unit having a sulfonic acid group and (ii) a portion which is uncoated with the composition.

DETAILED DESCRIPTION OF THE INVENTION

The present invention will be described in detail below.

The disadvantage of "the oxygen-intercepting layer hitherto studied which is dissolved in a photosensitive solution but is formed by floating on a surface of a photosensitive layer in coating and drying" is that the oxygen-intercepting layer is partially removed by rubbing with a conveyor roller in manufacturing and rubbing with interleaving sheet used for protecting a plate due to fluctuation in thickness during storage of the plate or due to vibration in transporting, and by touching a surface of the plate with a finger, a film or a printing frame in plate making, thus causing the removed portions to impair the properties (for example, reductions in image density, in sensitivity and in impression capacity associated with deterioration in polymerization rate in developing). In contrast, it has become clear that the use of the compound represented by formula (I), particularly stearic acid N-methylamide, can greatly prevent deterioration of the properties. However, it has been found that the single use of the compound represented by formula (I) remarkably lowers the friction coefficient of surfaces of the plates, causing the plates to slip when they are piled up in manufacturing. On the other hand, it has been found that when the compound represented by formula (II-a), (II-b) or (II-c) is used in combination with the compound represented by formula (I), the friction coefficient of the plates against a polyethylene surface of polyethylene-laminated paper used as interleaving sheet increases, which makes it possible to produce and process the plates in large amounts. Further, at this time, when the length of an alkyl group of the compound represented by formula (II-a), (II-b) or (II-c) is longer than that of the compound represented by formula (I), the effect of raising the friction coefficient is enhanced. Further, the compound represented by formula (II-a) which is a carboxylic acid type slightly reduces the oxygen-intercepting ability of the compound represented by formula (I), whereas the compound represented by formula (II-b) which is an alcohol type and the compound represented by formula (II-c) which is an amide type do not reduce the oxygen-intercepting ability of the compound represented by formula (I). The latter compounds are therefore more preferred.

The photosensitive composition containing a negative-working diazo resin is difficult to be affected by oxygen in air, compared with the composition containing no diazo resin. This is considered that the diazo resin produces a nitrogen gas which is inactive for polymerization on exposure. However, the addition of the diazo resin alone to the photosensitive composition cannot completely remove the influence of oxygen as mentioned above. Further, the method of adding a wax agent such as a higher fatty acid to the photosensitive composition to form an oxygen-intercepting layer is also known, but the effect thereof to block oxygen cannot be said to be sufficient. However, when a compound specifically selected from the compound which is soluble in a photosensitive solution, but floats on a surface of a photosensitive layer and is capable of forming an oxygen-intercepting layer during coating and drying according to the present invention is added to the photosensitive composition containing the diazo resin, unexpected effects can be obtained. The resultant composition is little affected by oxygen in air in exposing to light, whereby images having a high impression capacity can be formed.

The ethylenically unsaturated addition-polymerizable compound employed in the present invention is a compound containing at least one ethylenically unsaturated bond in its chemical structure, which has a chemical form such as a monomer, a prepolymer such as a dimer, a trimer or another oligomer, a mixture thereof or a copolymer thereof. Examples thereof include unsaturated carboxylic acids and salts thereof, esters of unsaturated carboxylic acids with aliphatic polyhydric alcohols, and amides of unsaturated carboxylic acids with aliphatic polyhydric amines.

Examples of the unsaturated carboxylic acids include acrylic acid, methacrylic acid, itaconic acid, crotonic acid, isocrotonic acid and maleic acid.

Examples of the salts of the unsaturated carboxylic acids include alkali metal salts (for example, sodium salts and potassium salts) of the above-mentioned unsaturated carboxylic acids.

Examples of the esters of the aliphatic polyhydric alcohols with the unsaturated carboxylic acids include acrylic acid esters (for example, ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, polyester acrylate oligomers); methacrylic acid esters (for example, tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis-[p-(3-methacryloxy-2-hydroxypropoxy)phenyl]dimethylmethane, bis-[p-(methacryloxyethoxy)phenyl]dimethylmethane); itaconic acid esters (e.g., ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate); crotonic acid esters (for example, ethylene glycol dicrotonate, tetramethylene glycol dicrotonate, pentaerythritol dicrotonate, sorbitol tetracrotonate); isocrotonic acid esters (for example, ethylene glycol diisocrotonate, pentaerythritol diisocrotonate, sorbitol tetraisocrotonate); and maleic acid esters (for example, ethylene glycol dimaleate, triethylene glycol dimaleate, pentaerythritol dimaleate, sorbitol tetramaleate). Further, mixtures of the above-mentioned esters can be included therein.

Examples of the amides of the aliphatic polyhydric amines with the unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide and xylylenebis-methacrylamide.

Other examples thereof include vinylurethane compounds containing two or more polymerizable vinyl groups in one molecule, in which a hydroxyl group-containing vinyl monomer shown in the following formula (VI) is added to a polyisocyanate compound containing two or more isocyanate groups in one molecule described in JP-B-48-41708:

$$CH_2=C(R^{12})COOCH_2CH(R^{13})OH \qquad (VI)$$

wherein $R^{12}$ and $R^{13}$ each represents H or $CH_3$.

The ethylenically unsaturated addition-polymerizable compound is used in an amount of from 5 to 50% by weight, preferably from 10 to 40% by weight, based on the whole components of the compositions of the present invention.

The aqueous alkali-soluble or swelling polymer which is capable of forming a film employed in the present invention is required to have the characteristics that the compatibility of the polymer with the ethylenically unsaturated addition-polymerizable compound and the photopolymerization initiator is good to such an extent that unmixing does not take place during the whole manufacturing steps of the photosensitive material from the preparation step of coating solution of the composition to the coating and drying steps; that development is possible after exposure as a photosensitive layer or a resist layer, although it may be, for example, solution development or peeling development; and that tough films can be formed as a photosensitive layer or a resist layer. In general, the polymer is suitably selected from linear organic high molecular polymers. Examples of the aqueous alkali-soluble or swelling polymer which is capable of forming a film include acidic vinyl copolymers having an acid value of 50 to 200 which contain a group such as —COOH, —PO$_3$H$_2$, —SO$_3$H—, S$_2$NH$_2$, or —SO$_2$NHCO—.

Specific examples thereof include addition polymers containing a carboxylic acid group at its side chain, for example, methacrylic acid copolymers (e.g., copolymer of methyl methacrylate with methacrylic acid, copolymer of ethyl methacrylate with methacrylic acid, copolymer of butyl methacrylate with methacrylic acid, copolymer of allyl methacrylate with methacrylic acid, copolymer of ethyl acrylate with methacrylic acid, copolymer of ethyl methacrylate with styrene and methacrylic acid); acrylic acid copolymers (for example, copolymer of ethyl acrylate with acrylic acid, copolymer of butyl acrylate with acrylic acid, copolymer of ethyl acrylate with styrene and acrylic acid). Furthermore, itaconic acid copolymers, crotonic acid copolymers, partially esterified maleic acid copolymers, and acidic cellulose derivatives containing a carboxylic acid group at their side chain are also included therein.

These high polymers may be used alone or by mixing two or more kinds of high polymers in appropriate ratios, in which the compatibility of those high polymers is good to such an extent that unmixing does not take place during the manufacturing steps from the preparation step of the coating solution to the coating and drying steps.

The molecular weight of the high polymer used in the present invention can vary over a wide range, depending upon the kind of the high polymer. In general, however, it is preferably from 5,000 to 2,000,000, more preferably from 10,000 to 1,000,000.

The composition ratio of the ethylenically unsaturated addition-polymerizable compound to the aqueous alkali-soluble or swelling polymer which is capable of forming a film preferably ranges from 0.5:9.5 to 5:5 by weight, more preferably from 1:9 to 3:7 by weight.

Examples of the photopolymerization initiator used in the present invention include α-carbonyl compounds described in U.S. Pat. Nos. 2,367,661 and 2,367,670, acyloin ethers described in U.S. Pat. No. 2,448,828, aromatic acyloin compounds substituted by α-hydrocarbons described in U.S. Pat. No. 2,722,512, polynuclear quinone compounds described in U.S. Pat. Nos. 3,046,127 and 2,951,758, combinations of triaryl imidazole dimers and p-aminophenyl ketones described in U.S. Pat. No. 3,549,367, trihalomethyl-S-triazine compounds described in JP-A-60-105667 and U.S. Pat. No. 4,239,850, acridine and phenazine compounds described in U.S. Pat. No. 3,751,259, and oxadiazole compounds described in U.S. Pat. No. 4,212,970. In order to exhibit sufficient effects as a lithographic printing plate of the present invention having the oxygen-intercepting layer difficult to be affected by the degree of printing frame vacuum and providing the stable properties (for example, sensitivity and impression capacity), S-triazine compounds having higher photopolymerization-initiating ability represented by the following formula (III) are preferably employed:

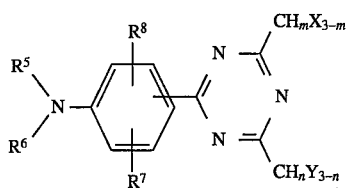

(III)

wherein $R_5$ and $R^6$ are the same or different and each represents a hydrogen atom, an alkyl group, a substituted alkyl group, an aryl group, a substituted aryl group, $-COR^9$ or $-CO-NR^{10}R^{11}$, or $R^5$ and $R^6$ may represent a nonmetallic atomic group which is capable of forming a heterocyclic ring with each other along with a nitrogen atom to which $R^5$ and $R^6$ are attached respectively; $R^9$ represents an alkyl group, a substituted alkyl group, an aryl group or a substituted aryl group; $R^{10}$ and $R^{11}$ are the same or different and each represents a hydrogen atom, an alkyl group, a substituted alkyl group, an aryl group or a substituted aryl group; $R^7$ and $R^8$ are the same or different and each represents a hydrogen atom, a halogen atom, an alkyl group or an alkoxy group; X and Y are the same or different and each represents a chlorine atom or a bromine atom; and m and n are the same or different and each represents 0, 1 or 2.

In the above-mentioned formula (III), the alkyl groups for $R^5$ to $R^{11}$ preferably have from 1 to 6 carbon atoms (for example, methyl, ethyl, isopropyl), and the aryl groups preferably have from 6 to 14 carbon atoms (for example, phenyl, naphthyl).

Examples of the substituents in the substituted alkyl groups and the substituted aryl groups for $R^5$, $R^6$, $R^9$, $R^{10}$ and $R^{11}$ include an aryl group (for example, phenyl), a halogen atom (for example, chlorine), an alkoxy group (for example, methoxy, ethoxy), a carboxyl group, a carboalkoxy group (alkoxycarbonyl group) (for example, carbomethoxy, carboethoxy), a carboaryloxy group (aryloxycarbonyl group), a cyano group, an acetyl group, an acyl group (for example, benzoyl), a nitro group, a dialkylamino group and sulfonyl derivatives represented by the following formulas (A) to (C):

| | |
|---|---|
| $-SO_2-Z^1$ | (A) |
| $-SO_2-O-Z^1$ | (B) |
| $-SO_2-NH-Z^1$ | (C) | wherein $Z^1$ represents a hydrogen atom, an alkyl group or an aryl group.

The substituents of the substituted aryl groups for $R^5$, $R^6$, $R^9$, $R^{10}$ and $R^{11}$ include an alkyl group in addition to the above-mentioned substituents.

When $R^5$ and $R^6$ represent a nonmetallic atomic group which is capable of forming a heterocyclic ring with each other along with a nitrogen atom to which $R^5$ and $R^6$ are attached respectively, examples of the heterocyclic ring include rings represented by the following formulas (D) to (H):

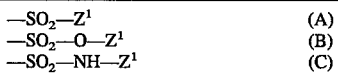

(D)

(E)

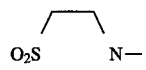

(F)

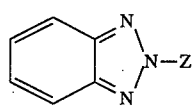

(G)

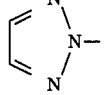

(H)

Of the substituents of the substituted alkyl group or the substituted aryl group for $R^5$ and $R^6$, electron-attracting groups such as a halogen atom, a carboxyl group, a carboalkoxy group, a cyano group, an acyl group, and sulfonyl derivatives are more preferred. Of the substituents of the substituted alkyl group or the substituted aryl group for $R^9$, electron-releasing groups such as a dialkylamino group and an alkoxy group are more preferred.

Of the compounds represented by the above-mentioned formula (III), particularly preferred compounds are compounds in which $R^5$ and $R^6$ are each a hydrogen atom, a carboalkoxymethyl group, a chloromethyl group, a chloroethyl group, a cyanomethyl group or a cyanoethyl group, and at least either of $R^5$ and $R^6$ is a group other than a hydrogen atom, or both $R^5$ and $R^6$ form the following group together with each other:

$$-C_2H_4-SO_2-C_2H_4-$$

and $R^7$ and $R^8$ are each a hydrogen atom, a halogen atom or an alkyl group.

The compounds represented by formula (III) which are employed in the photosensitive composition of the present invention can be prepared by cyclizing aromatic nitrile compounds represented by the following formula (IV) and haloacetonitriles, according to the method described in K. Wakabayashi, et al., *Bulletin of the Chemical Society of Japan*, vol. 42, pp. 2924–2930 (1960):

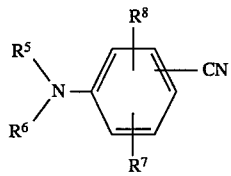

(IV)

wherein $R^5$ to $R^8$ have the same meanings as defined in formula (III).

Examples of the compounds as a photopolymerization initiator employed in the present invention are shown below. However, the photopolymerization initiators used in the present invention are not limited to these compounds.

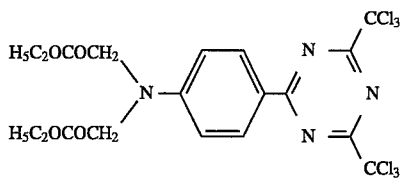

(1)

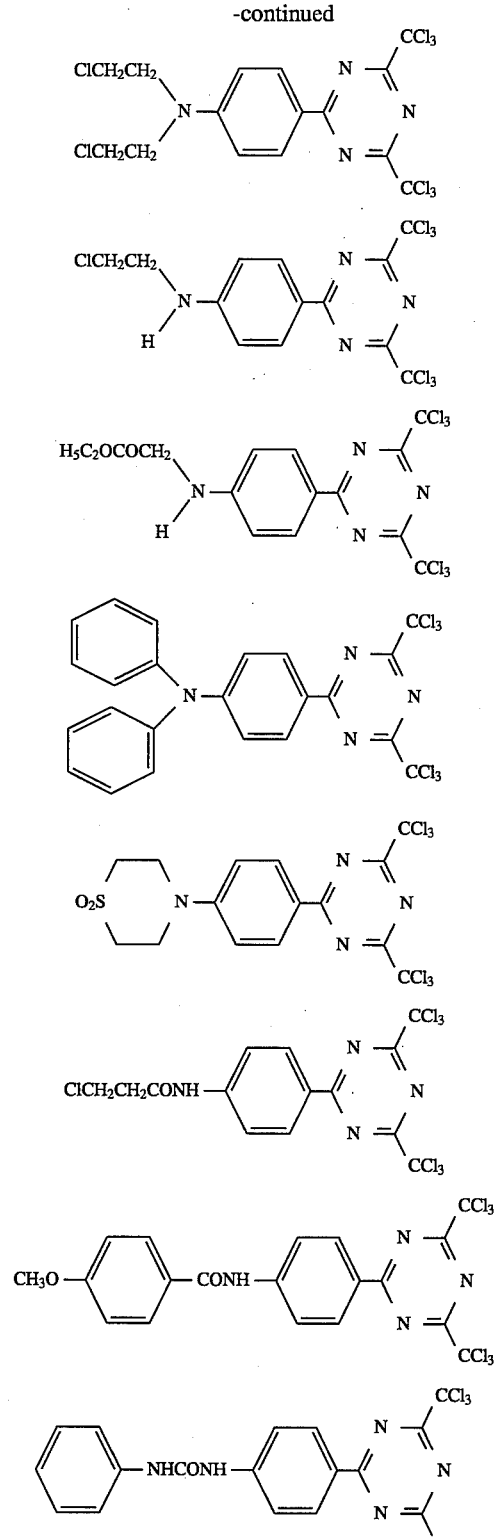
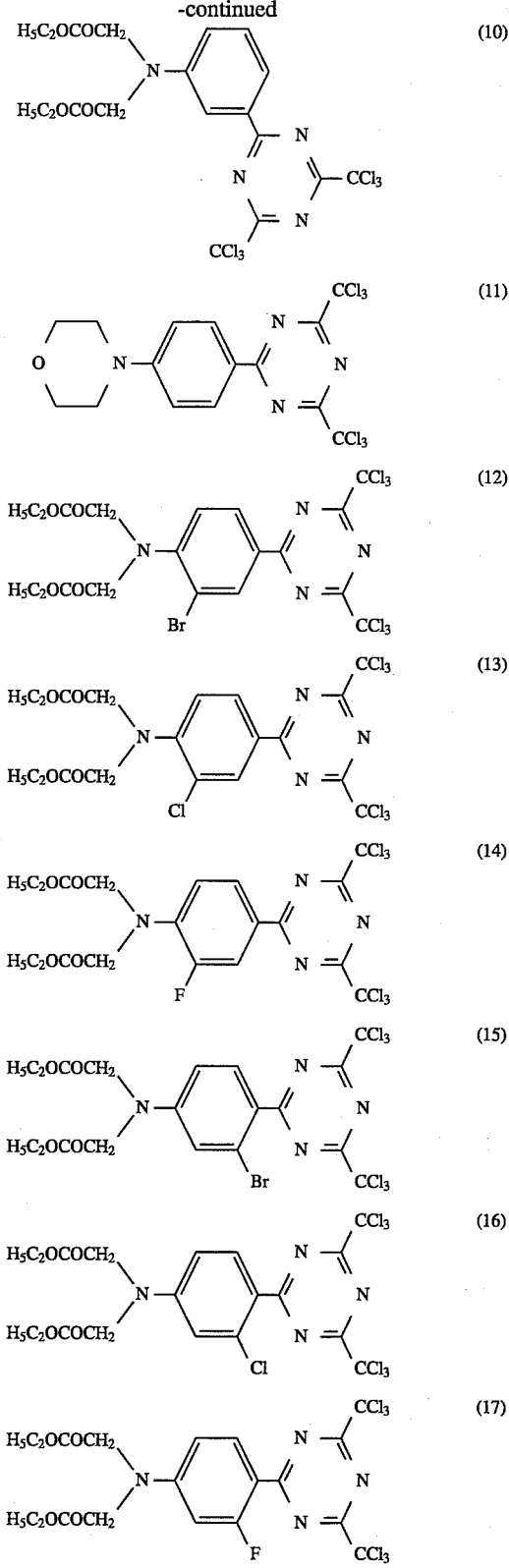

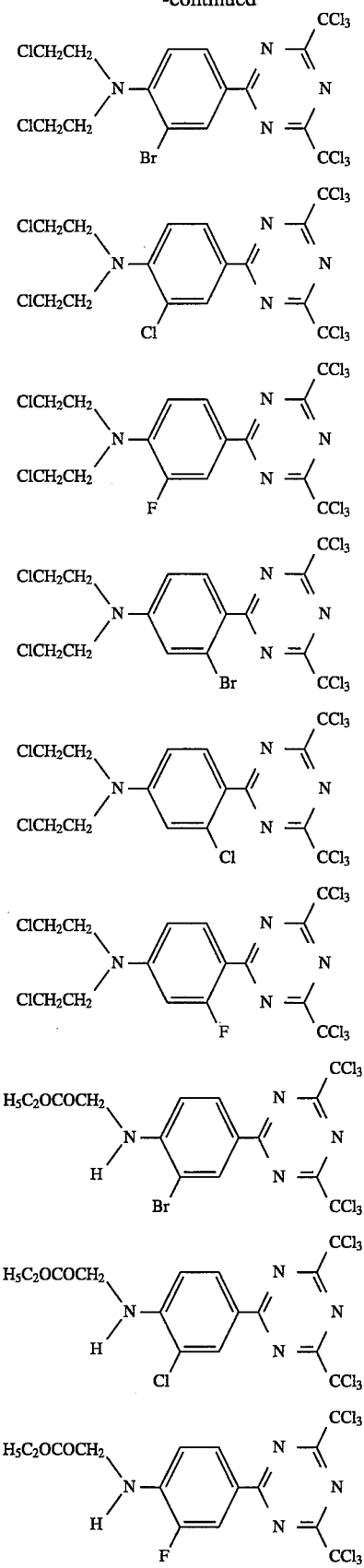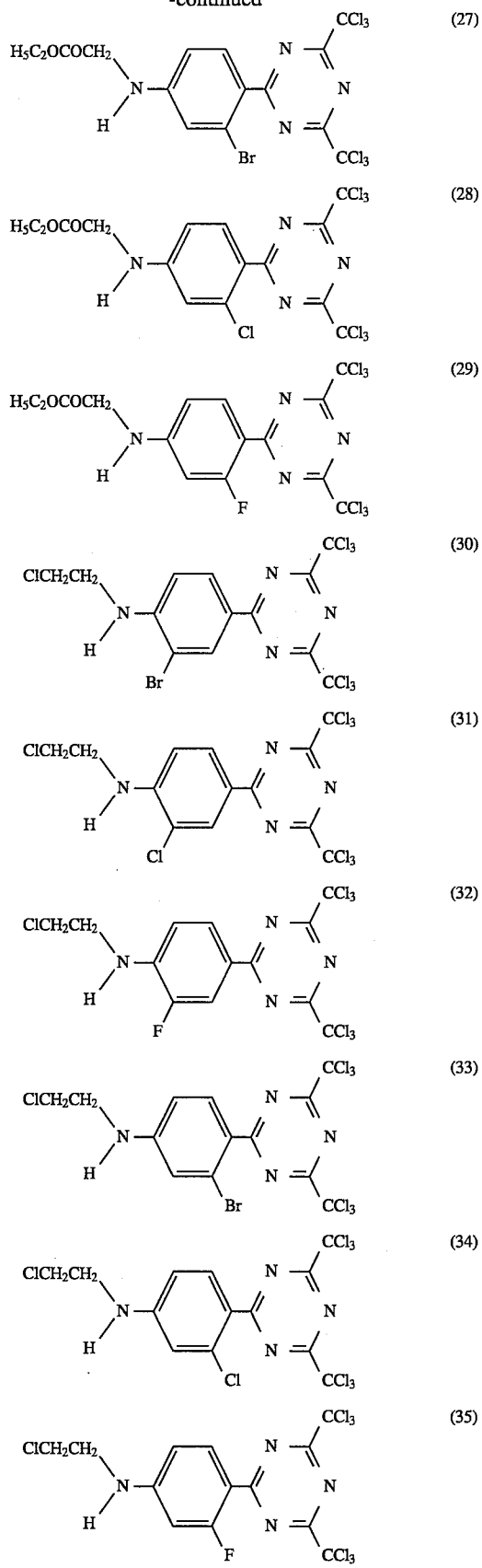

-continued

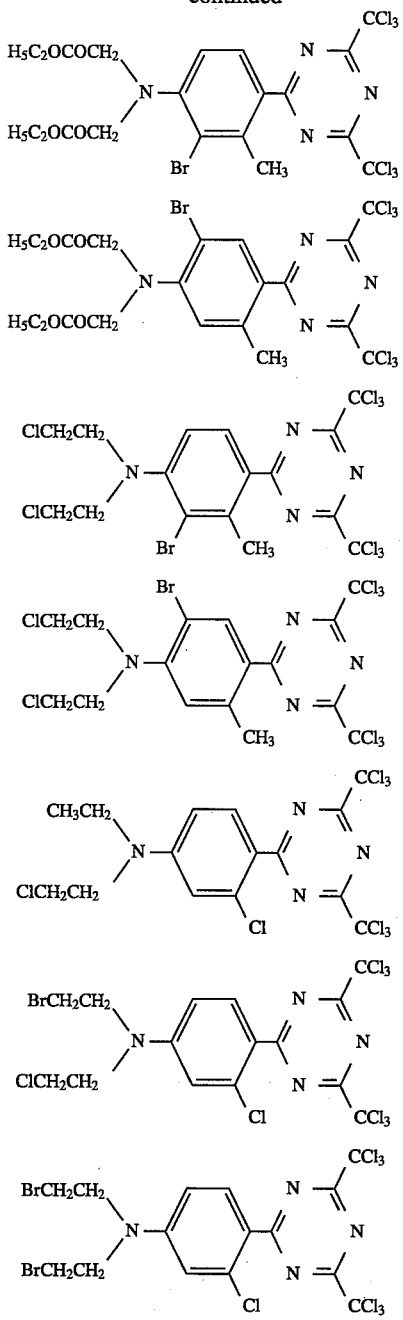

Of these compounds, Compound (22), Compound (12), Compound (1) and mixtures thereof are more preferred. The content of the photopolymerization initiator employed in the photosensitive composition of the present invention is normally minute, and too high content thereof brings about unfavorable results such as blocking of efficient rays. In order to obtain good results in the present invention, the amount of the photopolymerization initiator is from 0.01% to 20% by weight, more preferably from 1% to 10% by weight, based on the total amount of the ethylenically unsaturated addition-polymerizable compound and the aqueous alkali-soluble or swelling polymer which is capable of forming a film.

When a sensitizer is added to the photosensitive composition of the present invention, the sensitizer which can increase the photopolymerization rate by using together with the photopolymerization initiator represented by formula (III) is selected. Examples of such sensitizers include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzyl, dibenzylacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone and benzanthrone. Of these compounds, Michler's ketone is more preferred.

Further, preferred examples of the sensitizers used in the present invention include compounds represented by formula (V) described in JP-B-51-48516:

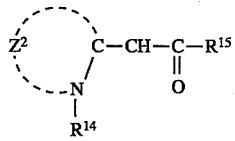

wherein $R^{14}$ represents an alkyl group (for example, methyl, ethyl, propyl) or a substituted alkyl group (for example, 2-hydroxyethyl, 2-methoxyethyl, carboxymethyl, 2-carboxyethyl); $R^{15}$ represents an alkyl group (for example, methyl, ethyl) or an aryl group (for example, phenyl, p-hydroxyphenyl, naphthyl, thienyl); $Z^2$ represents a nonmetallic group necessary for forming a nitrogen-containing heterocyclic nucleus usually used in cyanine dyes, for example, benzothiazoles (e.g., benzothiazole, 5-chlorobenzothiazole, 6-chlorobenzothiazole), naphthothiazoles (e.g., α-naphthothiazole, β-naphthothiazole), benzoselenazoles (e.g., benzoselenazole, 5-chlorobenzoselenazole, 6-methoxybenzoselenazole), naphthoselenazoles (e.g., α-naphthoselenazole, β-naphthoselenazole), benzoxazoles (e.g., benzoxazole, 5-methylbenzoxazole, 5-phenylbenzoxazole), naphthoxazoles (e.g., α-naphthoxazole, β-naphthoxazole).

Specific examples of the compounds represented by formula (V) have chemical structures constituted by combination of these $Z^2$, $R^{14}$ and $R^{15}$, and many of them exist as known substances. Accordingly, the compounds represented by formula (V) can be suitably selected from these known substances to use it.

Further, preferred examples of the sensitizer used in the present invention include merocyanine dyes described in U.S. Pat. No. 4,636,459 and JP-A-61-203444 and ketocoumarin compounds represented by the following formula (VI):

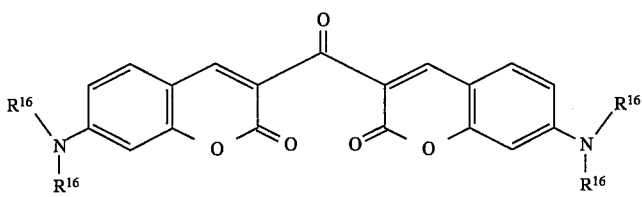

(VI)

wherein $R^{16}$ represents an alkyl group such as methyl or ethyl.

Further, in order to prevent undesirable thermopolymerization of the polymerizable compound containing an ethylenically unsaturated bond during manufacturing or storage, thermopolymerization inhibitors are desirably added to the composition of the present invention. Suitable examples of the thermopolymerization inhibitors include hydroquinone, p-methoxyphenol, di-t-butyl-p-cresol, pyrogallol, t-butylcatechol, benzoquinone, cuprous chloride, phenothiazine, chloranil, naphthylamine, β-naphthol, nitrobenzene and dinitrobenzene.

The component which is soluble in a photosensitive solution, but floats on a surface of a photosensitive layer to form an oxygen-intercepting layer during coating and drying comprises a compound represented by the following formula (I) and a compound represented by the following formula (II-a), (II-b) or (II-c):

$$R_1C(=O)N(R_2)(R_3) \quad (I)$$

$$R_4C(=O)OH \quad (II\text{-a})$$

$$R_4CH_2OH \quad (II\text{-b})$$

$$R_4C(=O)NH_2 \quad (II\text{-c})$$

wherein $R_1$ represents an alkyl group having from 15 to 25 carbon atoms; $R_2$ represents —H, —$CH_3$, —$C_2H_5$ or —$C_3H_7$; $R_3$ represents —$CH_3$, —$C_2H_5$ or —$C_3H_7$; $R_4$ represents an alkyl group having from 15 to 25 carbon atoms.

In the present invention, preferred examples of the compound represented by formula (I) include stearic acid N-methylamide, stearic acid N,N-dimethylamide, behenic acid N-methylamide and behenic acid N,N-dimethylamide, and stearic acid N-methylamide is more preferred.

In the present invention, preferred examples of the compound represented by formula (II-a) include stearic acid and behenic acid, preferred examples of the compound represented by formula (II-b) include stearyl alcohol and 1-docosanol, and preferred examples of the compound represented by formula (II-c) include stearic acid amide and behenic acid amide. When the alkyl group ($R_4$) of the compound represented by formula (II-a), (II-b) or (II-c) is longer than that ($R_1$) of the compound represented by formula (I), the effect of raising the friction coefficient is preferably enhanced. In particular, it is preferred to use 1-docosanol as a compound represented by formula (II-b) in combination with the compound represented by formula (I). The amount of the compound represented by formula (I) added is from 0.5 to 10% by weight, preferably from 1 to 5% by weight, based on the total amounts of all components. The added amount of the compound represented by formula (II-a), (II-b) or (II-c) is from 2 to 60% by weight, preferably from 10 to 50% by weight, based on the compound represented by formula (I).

As the negative-working diazo resin employed in the present invention, substantially water-insoluble and organic solvent-soluble diazo resins are suitable. Examples of such diazo resins include a reaction product between an anion and a condensed product prepared by condensing a diazo monomer as described below with a condensing agent such as formaldehyde, acetaldehyde, propionaldehyde, butyl aldehyde, isobutyl aldehyde, or benzaldehyde in a molar ratio of from 1:1 to 1:0.5, preferably from 1:0.8 to 1:0.6, according to conventional methods. Examples of the diazo monomers include 4-diazodiphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazodimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazophenylamine, 3-(n-propoxy)-4-diazodiphenylamine, and 3-(isopropoxy)-4-diazodiphenylamine. Examples of the anions include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenezenesulfonic acid, 1-naphthol-5-sulfonic acid, 2-methoxy-4-hydroxy-5-benzoylbenzenesulfonic acid, and p-toluenesulfonic acid. Of these, hexafluorophosphoric acid and alkyl aromatic sulfonic acid such as triisopropylnaphthalenesulfonic acid and 2,5-dimethylbenzenesulfonic acid are more preferred. Diazo resins described in U.S. Pat. No. 3,867,147 are also suitable for this use.

The amount of these diazo resins added is from 1 to 30% by weight, preferably from 3 to 15% by weight, based on the total amount of all components.

Besides the above-mentioned components, it is preferred that thermopolymerization inhibitors are further added to the photosensitive layer. The useful thermopolymerization inhibitors are similar to the above-mentioned thermopolymerization inhibitors which are added to prevent the undesirable thermopolymerization of the polymerizable compounds having ethylenically unsaturated bonds. In certain cases, dyes or pigments for coloring the photosensitive layer, or pH indicators as a burning agent may be added.

Further, phosphoric acid, phosphorous acid, tartaric acid, citric acid, malic acid, dipicolinic acid, polynuclear aromatic sulfonic acids and salts thereof, and sulfosalicylic acid can be added as stabilizing agents for the diazo resins, if necessary.

Furthermore, the matting agents described in JP-A-55-124147 and JP-A-55-32086 may be added to the photosensitive layer to improve the vacuum contact and to decrease oxygen on the surfaces of the photosensitive layers during exposure. However, a matting method described below is preferable for improving the vacuum contact.

In order to improve the quality of the coated surfaces and allow the compounds which can form the oxygen-intercepting layer by coating and drying to easily floats on the surface of the photosensitive layer, fluorine-based surfactants may be added to the photosensitive composition. Examples of the surfactants include those described in JP-A-62-170950.

Examples of solvent used in the present invention when the photosensitive composition is applied include ethylene dichloride, cyclohexanone, acetone, methyl ethyl ketone, methyl isobutyl ketone, methyl cellosolve acetate, methyl cellosolve, propylene glycol monomethyl ether, propylene glycol monomethyl ether acetate, diethylene glycol monomethyl ether, methanol, monochlorobenzene, toluene, ethyl acetate and aqueous methyl lactate. These solvents can be used alone or as mixed solvents, and the support can be coated with the photosensitive composition dissolved therein. The use of an ultrasonic dispersing machine is preferable for quick dissolution. The weight amount of the film is preferably from 0.1 to 10 g/m$^2$, more preferably from 0.5 to 5 g/m$^2$, after drying.

In the photosensitive lithographic printing plate of the present invention, a matting layer having a micro pattern comprising (i) a portion which coated with a composition comprising a copolymer containing at least one monomer unit having a sulfonic acid group and (ii) a portion which is uncoated with the composition is formed on the surface of the support coated with the photosensitive composition, whereby the time required for the vacuum contact can be reduced and the influence of the degree of printing frame vacuum can be removed, in addition to the effect of the above-mentioned oxygen-intercepting layer. A reduction of adhesion of the matting layer owing to the oxygen-intercepting layer and destruction of the oxygen-intercepting layer owing to the matting layer can be prevented by combining the photosensitive composition layer containing the thus selected component (E) with the specific matting layer.

The copolymer constituting the matting composition is a component containing at least one kind of sulfonic acid group-containing monomer unit. Examples of the monomer constituting such monomer unit (abbreviated as "monomer (unit) (a)") include p-styrenesulfonic acid, 2-acrylamido-2-methylpropanesulfonic acid, ethylenesulfonic acid, 2-chloroethylenesulfonic acid, ethylenedisulfonic acid, 1-propene-1-sulfonic acid, 1-propene-2-sulfonic acid, 2-methyl-1,3-propenedisulfonic acid, 1-butene-1-sulfonic acid, 1-pentene-1-sulfonic acid, 1-hexene-1-sulfonic acid, 2-phenylethylenesulfonic acid, 1-methyl-2-phenylethylenesulfonic acid, 3-chloroallylsulfonic acid, allylsulfonic acid, 3-chloro-2-butenesulfonic acid, 3-chlorometaallylsulfonic acid, metaallylsulfonic acid, 3-methyl-2-butene-2-sulfonic acid, 3-phenylallylsulfonic acid, 3-phenylmetaallylsulfonic acid, 2-benzylallylsulfonic acid, 2-chloro-4-styrenesulfonic acid, vinyltoluenesulfonic acid, and α-methylstyrenesulfonic acid. One or more kinds of monomers suitably selected from these monomers are copolymerized with at least one kind of additional monomers. In the present invention, more preferred monomers are p-styrenesulfonic acid, 2-acrylamido-2-methylpropanesulfonic acid and ethylenesulfonic acid.

The additional monomer copolymerized with the sulfonic acid group-containing monomer are alkylacrylates of which alkyl residues have from 1 to 10 carbon atoms and alkylmethacrylates of which alkyl residues have from 4 to 10 carbon atoms (abbreviated as "monomer (unit) (b)"). Examples of these monomers include methyl acrylate, ethyl acrylate, n-propyl acrylate, isopropyl acrylate, n-butyl acrylate, isobutyl acrylate, n-amyl acrylate, isoamyl acrylate, n-hexyl acrylate, 2-ethylhexyl acrylate, n-octyl acrylate, n-decyl acrylate, n-butyl methacrylate, isobutyl methacrylate, n-amyl methacrylate, 2-ethylhexyl methacrylate, n-octyl methacrylate, and n-decyl methacrylate. The monomer (b) constitutes a component for giving the adhesive property to the copolymers to the surfaces of the photosensitive layers. Further, monomer (abbreviated as "monomer (ubit) (c)") which constitutes a component for giving pressure resistance to the copolymers are desirably copolymerized. The monomer (c) is preferably a monomer of which homopolymer has a glass transition temperature (Tg) of 60° C. or higher. If the Tg is lower than 60° C., the function required as the monomer (c), that is, the function to give the pressure resistance to the copolymers is insufficient. For the definition of Tg, refer to *Polymer Handbook*, edited by J. Brandrup and E. H. Immergut, Interscience Publisher, III, p 61 (1966).

Examples of the monomer (c) include styrene, o-methylstyrene, m-methylstyrene, p-methylstyrene, 2,4-dimethylstyrene, 2,5-dimethylstyrene, 3,4-dimethylstyrene, 3,5-dimethylstyrene, 2,4,5-trimethylstyrene, 2,4,6-trimethylstyrene, o-ethylstyrene, o-sec-butylstyrene, o-tert-butylstyrene, p-fluorostyrene, 2,5-difluorostyrene, o-chlorostyrene, m-chlorostyrene, p41-chlorostyrene, 2,4-dichlorostyrene, 2,5-dichlorostyrene, 2,6-dichlorostyrene, 3,4-dichlorostyrene, p-bromostyrene, p-cyanostyrene, acrylonitriles, methacrylonitrile, methyl methacrylate, ethyl methacrylate, acrylamide, N-sec-butyl acrylamide, N-tert-butyl acrylamide, N,N-dibutyl acrylamide, and N-tert-butyl methacrylamide.

In the copolymer of the composition forming the matting layer of the invention, the amounts of the monomer units (a), (b) and (c) are preferably from 5 to 50 mol %, 10 to 35 mol % and 40 to 80 mol %, respectively. As the amount of the monomer unit (a) decreases below 5 mol %, the solubility of the copolymer in a developing solution becomes poor. On the other hand, as the amount increases exceeding 50 mol %, the copolymer becomes liable to be affected by moisture and, in addition, the adhesion of the photosensitive layer to the surface is reduced. As the amount of the monomer unit (b) decreases below 10 mol %, the adhesion of the copolymer to the photosensitive layer is reduced. On the other hand, as the amount increases exceeding 35 mol %, the pressure resistance of the copolymers decreases and the adhesion to the photosensitive layer becomes too strong. The storage of the printing plate at a particularly high temperature strengthens the adhesion to the photosensitive layer, which is accompanied by destruction of the oxygen-intercepting layer under the matting layer. Further, as the amount of the monomer unit (c) decreases below 40 mol %, the hardness and pressure resistance of the copolymer decrease. On the other hand, as the amount increases exceeding 80 mol %, the adhesion to the photosensitive layer decreases. Particularly preferred amounts of the monomer units (a), (b) and (c) are from 8 to 25 mol %, from 10 to 30 mol %, and from 50 to 75 mol %, respectively. Synthetic methods of such copolymers and methods for forming the matting layers are described in JP-A-58-182636 in detail.

In a combination of the specific oxygen-intercepting layer and matting layer thus selected, the adhesion of the matting layer is not reduced by the oxygen-intercepting layer, and the oxygen-intercepting layer is not destroyed by the matting layer.

Examples of the support suitable for being coated with the photosensitive composition in the present invention include dimensionally stable sheets which have hitherto been used as a support for the printing plates. Specific examples of such support include paper, paper laminated with plastics (for example, polyethylene, polypropylene, polystyrene), metallic sheets (for example, aluminum (including aluminum alloys), zinc, iron, copper), plastic films (for example, cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal), and paper or plastic films laminated or deposited with the above-mentioned metals. Of these, the aluminum sheets are more preferred. The aluminum sheets include pure aluminum sheets and aluminum alloy sheets. Various types of the aluminum alloys can be used, which include aluminum alloys with another metal such as silicon, copper, manganese, magnesium, chromium, zinc, lead or nickel. These compositions may contain impurities in negligible amounts in addition to some amounts of iron and titanium.

The supports are subjected to a surface treatment if necessary. For example, in the case of the photosensitive lithographic printing plate, hydrophilizing treatment is conducted on the surfaces of the supports. Various hydrophilizing treatment methods are known. For example, the support having a plastic surface is treated according to so-called a surface treatment method such as chemical treatment, electrical discharge treatment, flame treatment, ultraviolet treatment, high frequency treatment, glow discharge treatment, active plasma treatment and laser treatment (for example, U.S. Pat. Nos. 2,764,520, 3,497,407, 3,145,242, 3,376,208, 3,072,483, 3,475,193 and 3,360,448, and British Patent 788,365), or after such surface treatment has been conducted, undercoating layers may be formed on the plastic surface.

Various attempts for coating methods have also been made. There are a multiple layer method in which a first layer is adhered by a plastic and a good adhesive hydrophobic resin layer is formed by coating, and then, as a second layer, a hydrophilic resin layer is formed by coating; and a single layer method in which a layer of a resin containing a hydrophobic group and a hydrophilic group is formed by coating.

The supports having a surface of metal, particularly aluminum, are preferably subjected to a surface treatment such as sand dressing treatment, dipping treatment in aqueous solutions of sodium silicate, potassium fluorodizirconate or phosphates or anodizing treatment. Further, the aluminum plate which is dipped in an aqueous solution of sodium silicate after the sand dressing treatment described in U.S. Pat. No. 2,714,066 or the aluminum plate which is dipped in an aqueous solution of an alkali metal silicate after the anodizing treatment described in U.S. Pat. No. 3,181,461 is also preferably used. The above-mentioned anodizing treatment is conducted by passing current in an electrolyte comprising one or more kinds of aqueous or non-aqueous solutions of an inorganic acid such as phosphoric acid, chromic acid, sulfuric acid or boric acid, an organic acid such as oxalic acid or sulfamic acid, or a salt thereof, using the aluminum plate as an anode.

The electrodeposition of silicates described in U.S. Pat. No. 3,658,662 is also effective.

Such hydrophilizing treatment is conducted for making the surface of the support hydrophilic, and in addition, for preventing harmful reactions with the photosensitive composition formed thereon and for improving the adhesive property to the photosensitive layer.

Rolling oil on the surface of the aluminum plate may be removed if necessary prior to the sand dressing treatment of the aluminum plate, and the aluminum plate may be pretreated to allow the clear surface to be exposed. For the former treatment, solvents such as trichlene or surfactants are employed. For the latter treatment, alkali etching agents such as sodium hydroxide and potassium hydroxide are widely used.

For the sand dressing method, any of mechanical, chemical and electrochemical methods is effective. The mechanical methods include a ball abrasion method, a ballast abrasion method and a brush abrasion method in which the surface is rubbed with a nylon brush using an aqueous dispersion slurry of an abrasive material such as pumice. As the chemical method, a method of dipping the plate in a saturated aqueous solution of a aluminum salt of a mineral acid described in JP-A-54-31187 is preferred. A preferred electrochemical method is an AC electrolytic process conducted in an acidic electrolyte such as hydrochloric acid, nitric acid or a mixture thereof. Of these surface-roughening processes, the combination of a mechanical surface-roughening process and an electrochemical surface-roughening process described in JP-A-55-137993 is preferred because of a strong adhesion of ink-receptable images to the support.

The sand dressing process as described above is preferably conducted so that the central line average surface roughness (Ra) on the surface of the aluminum plate is from 0.2 to 1.0 μm.

The sand dressed aluminum plate thus sand dressed is washed with water and chemically etched if necessary.

Etching solutions are generally selected from basic or acidic aqueous solutions dissolving aluminum. In this case, a film, different from aluminum, which is derived from components of the etching solution should not be formed on the etched surface. Preferred examples of the etching agents include basic substances (e.g., sodium hydroxide, potassium hydroxide, sodium tertiary phosphate, sodium secondary phosphate, potassium tertiary phosphate, potassium secondary phosphate); and acidic substances (e.g., sulfuric acid, persulfuric acid, phosphoric acid, hydrochloric acid, salts thereof). Salts of metals having a smaller ionization tendency than aluminum, for example, zinc, chromium, cobalt, nickel and copper, are unfavorable because unnecessary films are formed on the etched surface.

The concentration and temperature of these etching agents used are most preferably set so that the dissolving rate of aluminum or its alloys is 0.3 to 40 $g/m^2$ per minute of dipping time. However, higher or lower values than this range are also allowed.

Etching is conducted by dipping the aluminum plates in the above-mentioned etching solutions or by coating said aluminum plates with the etching solutions, and the plates are preferably treated so that the etching amount is from 0.5 to 10 $g/m^2$.

As the above-mentioned etching agents, basic solutions are desirably used because of their fast etching speed. In this case, since smuts are formed, they are usually desmutted. Acids used for the desmutting treatment include nitric acid, sulfuric acid, phosphoric acid, chromic acid, hydrofluoric acid and borohydrofluoric acid.

The aluminum plates etched may be washed with water and anodized, if necessary. Anodizing can be achieved according to the customary methods hitherto conducted in this field. Specifically, an anodized film is formed on the surface of the aluminum support by passing direct current or alternating current to aluminum in an aqueous solution or non-aqueous solution of sulfuric acid, phosphoric acid, chromic acid, oxalic acid, sulfamic acid, benzenesuflonic acid or a combination of two or more kinds of these acids.

Conditions of anodizing vary depending upon an electrolyte used, and therefore, cannot be definitely determined. In general, however, the concentration of the electrolyte preferably is from 1 to 80% by weight, the solution temperature from 5° to 70° C., the current density from 0.5 to 60 A/dm$^2$, the voltage from 1 to 100 V, and the time required for electrolysis from 30 seconds to 50 minutes.

Of these anodizing treatment methods, anodizing conducted with high current density in sulfuric acid described in British Patent 1,412,768 and anodizing conducted in an electrolytic bath of phosphoric acid described in U.S. Pat. No. 3,511,661 are more preferred.

The aluminum plates surface roughened and subsequently anodized as described above may be hydrophilized if necessary. Preferred examples thereof include methods of treating with an aqueous solutions of alkali metal silicate, (for example, sodium silicate) disclosed in U.S. Pat. Nos. 2,714,066 and 3,181,461, with potassium fluorozirconate disclosed in JP-B-36-22063, and with polyvinyl phosphonic acid disclosed in U.S. Pat. No. 4,153,461.

The thus treated support may be coated with various compounds such as polyvinyl phosphonic acid, phenylphosphonic acid, sulfonic acid-containing polymers, carboxylic acid-containing polymers and yellow dyes, if necessary, for the purposes of improving hydrophilic property, preventing harmful reactions with the photosensitive compositions, improving the adhesion to the photosensitive layers, and absorbing halation from the supports, prior to coating of the photosensitive composition of the present invention.

The present invention is now illustrated in greater detail by way of the following Examples, but it should be understood that the present invention is not to be deemed to be limited thereto. All percents, parts and ratios are by weight unless otherwise indicated.

EXAMPLES

Example 1 to 6 and Comparative Examples 1 to 4

A 0.3 mm-thick Al—Mn—Mg alloy aluminum plate was dipped in a 10% aqueous solution of sodium hydroxide at 70° C. for 40 seconds to etch it, followed by washing with running water. Then, it was neutralized and washed with a 30% aqueous solution of $H_2SO_4$ for 20 seconds, and subsequently washed with water. The resulting plate was subjected to an electrolytic surface-roughening treatment in a 1% aqueous solution of nitric acid at a current density of 30 A/dm$^2$ at a quantity of electricity on an anode of 350 C/dm$^2$, using alternating rectangular wave current of 60 Hz. The plate was then treated with a 5% aqueous solution of sodium hydroxide at 35° C. for 7 seconds. After washing with water, the plate was neutralized with a 30% aqueous solution of sulfuric acid for 20 seconds, followed by washing with water. Thereafter, the plate was anodized in a 15% aqueous solution of sulfuric acid at a current density of 2 A/dm$^2$ for 3 minutes. Then, the plate was dipped in a 2.5% aqueous solution of sodium silicate at 65° C., washed with water and dried to prepare a support for a lithographic printing plate. The aluminum plate thus treated was coated with a photosensitive solution having the following composition so as to give a dried amount coated of 2.0 g/m$^2$, and dried at 100° C. for 2 minutes to obtain a photosensitive lithographic printing plate. Additives for the oxygen-intercepting layer used in composition A of the photosensitive solution and the amounts thereof are each shown in Table 1.

Composition of Photosensitive Solution A:

| | |
|---|---|
| Allyl methacrylate/methacrylic acid copolymer (copolymerization molar ratio: 85/15) | 3.5 g |
| Dipentaerythritol pentaacrylate | 0.5 g |
| Pentaerythritol tetraacrylate | 0.5 g |
| $PF_6$ salt of condensed product of p-diazodiphenylamine and formaldehyde | 0.15 g |
| Photopolymerization initiator (Example Compound 22) | 0.35 g |
| Dipicolinic acid | 0.1 g |
| Additives for oxygen-intercepting layer | (shown in Table 1) |
| Victoria Pure Blue BOH | 0.07 g |
| Megafac F-177 (fluorine surfactant manufactured by Dainippon Ink and Chemicals, Inc.) | 0.05 g |
| Methyl lactate | 10 g |
| Propylene glycol monomethyl ether | 35 g |
| Methyl ethyl ketone | 25 g |
| Methanol | 10 g |
| Water | 3.5 g |

A piece of the photosensitive printing plate was coated with a 20% aqueous solution of the following copolymer by electrostatic spray, and dried by exposing it to a temperature of 60° C. for 5 seconds to mat the surface of the photosensitive printing plate. Composition of Copolymer:

| | |
|---|---|
| Methyl methacrylate | 60 mol % |
| Ethyl acrylate | 20 mol % |
| 2-Acrylamido-2-methylpropanesulfonic acid (partly sodium salt) | 20 mol % |

The amount of the copolymer coated was 0.1 g/m$^2$, the number of solution drops was 50 to 100/mm$^2$, the height of the dried resin layer was 2 to 6 μm, and the width was 20 to 150 μm.

Fuji PS Step Guide manufactured by Fuji Photo Film Co., Ltd. (a gray scale in which the transmission density discontinuously changes at ΔD=0.15) was allowed to adhere to the photosensitive layer of the photosensitive lithographic printing plate thus obtained, and then exposed to a metal halide lamp of 10 A at a distance of 70 cm for 1 minute. Development was conducted with a developing solution having the following composition described in JP-B-56-42860 to remove unexposed portions:

| | |
|---|---|
| Sodium sulfite | 3 g |
| Benzyl alcohol | 30 g |
| Triethanolamine | 20 g |
| Monoethanolamine | 5 g |
| Pelex NBL (sodium butylnaphthalene-sulfonate manufactured by Kao Atlas Co., Ltd.) | 30 g |
| Water | 1,000 g |

Water

The results obtained are shown in Table 1 below.

In Table 1, "rubbing" was carried out by rubbing the plate surface with fingers wearing cotton working gloves.

The friction coefficient with interleaving sheet was measured by a statical friction coefficient measurement apparatus HEIDON manufactured by Sinto Scientific Co., Ltd. The interleaving sheet was polyethylene-laminated paper for inhibiting the scratch and adhesion of the laminated printing plate.

The reduction in image density of rubbed portion in developing was evaluated by fine ranks of A to E. "A" stands for the best quality and "E" stands for the worst quality.

The sensitivity was decided by step numbers (integers of 1 to 15) which correspond to each conclusion of Fuji Step Guide (produced by Fuji Photo Film Co., Ltd.). Solid means a thoroughly remaining step number on the plate. Tail means a thoroughly developed step number on the plate.

TABLE 1

| | Example No. | | | Example 1 | Example 2 | Example 3 | Example 4 | Example 5 | Example 6 |
|---|---|---|---|---|---|---|---|---|---|
| | Additives for Oxygen-intercepting Layer | | | Stearic acid N-methyl-amide (0.12); Stearic acid | Stearic acid N-methyl-amide (0.12); Behenic acid | Stearic acid N-methyl-amide (0.12); Stearyl alcohol | Stearic acid N-methyl-amide (0.12); 1-Docosanol | Stearic acid N-methyl-amide (0.12); Stearic acid amide | Stearic acid N-methyl-amide (0.12); Behenic acid amide |
| | (Added Amount: g) | | | (0.04) | (0.04) | (0.04) | (0.04) | (0.04) | (0.04) |
| No Mat Formed | After Plate Making | Sensi-tivity (Solid/ Tail) | With Rubbing | 5.5/11.0 | 5.5/11.0 | 5.5/11.0 | 5.5/11.0 | 5.5/11.0 | 5.5/11.0 |
| | | | Without Rubbing | 3.5/9.5 | 3.5/9.5 | 4.0/10.0 | 4.5/10.5 | 4.0/10.0 | 4.5/10.0 |
| | | Reduction in Image Density of Rubbed Portion in Developing | | C A and B | C | B | A | B | Between |
| | Before Plate Making | Forced Storage at 45° C., 75% for 3 Days | | No adhesion to the interleaving sheet and slight fluctuation of the oxygen-intercepting | | | | | |
| | | Friction Coefficient with Interleaving Sheet (Polyethylene Surface) | | 0.38 | 0.50 | 0.38 | 0.48 | 0.38 | 0.50 |
| Mat Formed | After Plate Making | Mat Adhesivity Reduction in Mat Image Density in Developing After Forced Storage at 45° C., 75% for 3 Days | | Good Not generated | Good Not generated | Good Not generated | Good Not generated | Good Not generated | Good Not generated |

| | Example No. | | | Comparative Example 1 | Comparative Example 2 | Comparative Example 3 | Comparative Example 4 |
|---|---|---|---|---|---|---|---|
| | Additives for Oxygen-intercepting Layer (Added Amount: g) | | | Behenic acid amide (0.16) | Behenic acid (0.16) | 1-Docosanol (0.16) | Stearic acid N-methylamide (0.16) |
| No Mat Formed | After Plate Making | Sensi-tivity (Solid/ Tail) | With Rubbing | 3.0/9.0 | 4.5/10.5 | 5.0/11.0 | 5.5/11.5 |
| | | | Without Rubbing | 2.0/8.0 | 3.0/9.5 | 3.5/9.5 | 3.5/10.0 |
| | | Reduction in Image Density of Rubbed Portion in Developing | | E | C | C | B |
| | Before Plate Making | Forced Storage at 45° C., 75% for 3 Days | | No adhesion to the interleaving sheet and slight fluctuation of the oxygen-intercepting layer | Adhesion to the interleaving sheet and destruction of the oxygen-intercepting layer | | No adhesion to the interleaving sheet and slight flucuation of the oxygen-intercepting layer |
| | | Friction Coefficient with Interleaving Sheet (Polyethylene Surface) | | 0.35 | 0.30 | 0.45 | 0.28 |
| Mat Formed | After Plate Making | Mat Adhesivity Reduction in Mat Image Density in Developing After Forced Storage at 45° C.-75% for 3 Days | | Slightly weak Generated | Slightly weak Generated | Good Generated | Good Not generated |

The results show that the plate of Comparative Example 4 using stearic acid N-methylamide has high oxygen-intercepting ability, which is not decreased by rubbing, compared with the plates of Comparative Examples 1 to 3 in which known additives for oxygen-intercepting layers (described in the examples of JP-A-63-63031) are used. Further, in Comparative Examples 2 and 3, the oxygen-intercepting layers show lower heat resistance, resulting in adhering to the interleaving sheet in forced storage at 45° C.-75% RH for 3 days, whereas Comparative Example 4 shows good heat resistance as well as Comparative Example 1. Comparative Example 4 is also satisfactory in the adhesion of the mat, and in addition, the oxygen-intercepting layer thereof is not destroyed by the mat even after the forced storage at 45° C.-75% RH for 3 days, not to cause the reduction in mat image density in developing. However, the disadvantage of Comparative Example 4 is that the plate obtained readily slips because of a low friction coefficient with the interleaving sheet, which makes it difficult to pile up a large number of the printing plates during manufacturing and processing thereof.

On the other hand, Examples 1 to 6 in which stearic acid, behenic acid, stearyl alcohol, 1-docosanol, stearic acid amide, and behenic acid amide are used in combination with stearic acid N-methylamide, respectively, show high friction coefficients with the interleaving sheet, which enables the printing plates to be manufactured and processed. In this case, "with rubbing" of Examples 1 and 2 in which the carboxylic acid type compounds are combined with stearic acid N-methylamide shows slightly lower oxygen-intercepting ability than "without rubbing" of Comparative Example 4 in which only stearic acid N-methylamide is used. On the other hand, "with rubbing" of Examples 3 to 6 in which the alcohol or amide type compounds are combined with stearic acid N-methylamide is smaller in a reduction in oxygen-intercepting ability than Comparative Example 4. "With rubbing" of Examples 3 to 6 after rubbed shows tendency to improve the oxygen-intercepting ability rather than "with rubbing" of Comparative Example 4. This shows that the rubbing of the surfaces of the plates on handling, or on exposure to light does not cause the oxygen-intercepting ability to reduce, keeping the impression capacity, sensitivity and image density satisfactory.

Further, Examples 2, 4 and 6 having longer alkyl groups ($R_4$) in formulas (II-a), (II-b) and (II-c) than Examples 1, 3 and 5 preferably show higher friction coefficients with the interleaving sheet.

Accordingly, Examples 4 and 6 are most preferable.

Furthermore, Examples 1 to 6 give good results in heat resistance, adhesive property of the mats, and the effect of the mats on the oxygen-intercepting layers without losing the merits of Comparative Example 4.

EXAMPLES 7 TO 11

A surface of an aluminum plate of 0.30 mm in thickness (material JIS 1050) was sand dressed with a nylon brush using an aqueous suspension of pumice stone of 400 meshes, and then fully washed with water. The plate was etched by dipping in a 10% aqueous solution of sodium hydroxide at 70° C. for 60 seconds, washed with running water, and neutralized and washed with a 20% aqueous solution of $HNO_3$, followed by washing with water. Electrolytic surface-roughening treatment of the etched surface was conducted at a quantity of electricity on an anode of 160 coulombs/dm$^2$ in a 1% aqueous solution of nitric acid using alternating wave shape current of sine wave under the condition of $V_A$=12.7 V. The surface roughness was measured to be 0.6 μm ($R_a$ indication). Subsequently, the plate was dipped in a 30% aqueous solution of $H_2SO_4$ to desmut it at 50° C. for 2 minutes, and thereafter, anodized in a 20% aqueous solution of $H_2SO_4$ at a current density of 2 A/dm$^2$ so as to give a thickness of 2.7 g/m$^2$. Then, the plate was dipped in a 2.5% aqueous solution of sodium silicate at 70° C. for 1 minute, washed with water, and dried.

The aluminum plate thus treated was coated with a photosensitive solution having the following composition so as to give a dry amount coated of 1.8 g/m$^2$, and dried at 100° C. for 2 minutes to obtain a photosensitive lithographic printing plate. Photopolymerization initiators, additives for the oxygen-intercepting layers used here, and amounts thereof used in the photosensitive solutions are each shown in Table 2. Composition of Photosensitive Solution:

| | |
|---|---|
| Allyl methacrylate/methacrylic acid copolymer (copolymerization molar ratio: 85/15) | 3 g |
| Dipentaerythritol hexaacrylate | 1 g |
| $PF_6$ salt of condensed product of p-diazodiphenylamine and formaldehyde | 0.2 g |
| Photopolymerization initiator | (indicated in Table 2) |
| Malic acid | 0.05 g |
| Dipicolinic acid | 0.05 g |
| Additives for oxygen-intercepting layer | (indicated in Table 2) |
| Naphthalenesulfonic acid salt of Victoria Pure Blue | 0.1 g |
| Megafac F-177 (fluorine surfactant manufactured by Dainippon Ink and Chemicals, Inc.) | 0.05 g |
| Fluorine surfactant (N-bulylperfluorooctane sulfonamide ethylacrylate ($C_8F_{17}SO_2N(C_4H_9)CH_2CH_2$ OCOCH=$CH_2$)/ poly(oxyalkylene) acrylate ($CH_3O(C_2H_4O)_7$ COCH=$CH_2$) (60/40 by weight ratio, molecular weight: 15,000) described in Example 1 of JP-A-62-170950) | 0.01 g |
| Ethylene glycol monomethyl ether | 20 g |
| Propylene glycol monomethyl ether | 25 g |
| Methyl ethyl ketone | 35 g |
| Water | 4 g |

The thus obtained photosensitive lithographic printing plates were treated in the same manner as in Example 1.

TABLE 2

| Example No. | Photopolymerization Initiators and Added Amount (g) | | Additives for Oxygen-intercepting Layer and Added Amount (g) | |
|---|---|---|---|---|
| Example 7 | Compound (1) | 0.15 | Stearic acid N-methylamide | 0.14 |
| | Compound (12) | 0.30 | 1-Docosanol | 0.06 |
| Example 8 | Compound (22) | 0.35 | Stearic acid N,N-dimethylamide | 0.12 |
| | | | 1-Docosanol | 0.04 |
| Example 9 | Compound (22) | 0.35 | Behenic acid N-methylamide | 0.12 |
| | | | 1-Docosanol | 0.04 |
| Example 10 | Compound (1) | 0.15 | Stearic acid N-methylamide | 0.14 |
| | Compound (12) | 0.30 | Behenic acid amide | 0.06 |
| Example 11 | Compound (22) | 0.40 | Stearic acid N-methylamide | 0.14 |
| | | | Behenic acid amide | 0.06 |

Matting layer formation, exposure and development were conducted for the thus prepared photosensitive lithographic printing plates in the same manner as in Examples 1 to 6 to obtain good results similar to those in Examples 1 to 6.

As is described above, the present invention can provide novel photosensitive compositions and photosensitive lithographic printing plates which are not affected by oxygen in exposing to light and give high impression capacity in lithographic printing plates.

Furthermore, the present invention can provide novel photosensitive compositions and photosensitive lithographic printing plates in which the adhesive property of the matting layers comprising a coated portion and a non-coated portion are not affected by the oxygen-intercepting layer, and the oxygen-intercepting layer is not destroyed by the matting layer.

While the invention has been described in detail and with reference to specific embodiments thereof, it will be apparent to one skilled in the art that various changes and modifications can be made therein without departing from the spirit and scope thereof.

What is claimed is:

1. A photosensitive composition comprising, in admixture:
   (A) an ethylenically unsaturated addition-polymerizable compound,
   (B) an aqueous alkali-soluble or swelling polymer which is capable of forming a film,
   (C) a photopolymerization initiator,
   (D) a negative-working diazo resin, and
   (E) a component which is soluble in a photosensitive solution, but floats on a surface of a photosensitive layer and is capable of forming an oxygen-intercepting layer during coating and drying,
   wherein the component (E) comprises a compound represented by the following formula (I) and a compound represented by the following formula (II-a), (II-b) or (II-c):

$R^1C(=O)N(R^2)(R^3)$      (I)

$R^4C(=O)OH$      (II-a)

$R^4CH_2OH$      (II-b)

$R_4C(=O)NH_2$      (II-c)

wherein $R^1$ represents an alkyl group having from 15 to 25 carbon atoms;
   $R^2$ represents —H, —CH$_3$, —C$_2$H$_5$ or —C$_3$H$_7$;
   $R^3$ represents —CH$_3$, —C$_2$H$_5$ or —C$_3$H$_7$; and
   $R^4$ represents an alkyl group having from 15 to 25 carbon atoms.

2. A presensitized plate comprising
   (1) a support coated with a photosensitive composition comprising
      (A) an ethylenically unsaturated addition-polymerizable compound,
      (B) an aqueous alkali-soluble or swelling polymer which is capable of forming a film,
      (C) a photopolymerization initiator,
      (D) a negative-working diazo resin, and
      (E) a component which is soluble in a photosensitive solution, but floats on a surface of a photosensitive layer and is capable of forming an oxygen-intercepting layer during coating and drying,
   wherein the component (E) comprises a compound represented by the following formula (I) and a compound represented by the following formula (II-a), (II-b) or (II-c):

$R^1C(=O)N(R^2)(R^3)$      (I)

$R^4C(=O)OH$      (II-a)

$R^4CH_2OH$      (II-b)

$R^4C(=O)NH_2$      (II-c)

wherein $R^1$ represents an alkyl group having from 15 to 25 carbon atoms;
   $R^2$ represents —H, —CH$_3$, —C$_2$H$_5$ or —C$_3$H$_7$;
   $R^3$ represents —CH$_3$, —C$_2$H$_5$ or —C$_3$H$_7$; and
   $R^4$ represents an alkyl group having from 15 to 25 carbon atoms, and
   (2) a matting layer provided thereon, wherein the surface of the matting layer has a micro pattern comprising (i) a portion which is coated with a composition comprising a copolymer containing at least one monomer unit having a sulfonic acid group and (ii) a portion which is uncoated with the composition.

3. The photosensitive composition as claimed in claim 1, wherein the photopolymerization initiator (C) is a photosensitive S-triazine compound represented by the following formula (III):

wherein $R^5$ and $R^6$ are the same or different and each represents a hydrogen atom, an alkyl group, an aryl group, —C(=O)R$^9$ or —C(=O)—NR$^{10}$R$^{11}$, or $R^5$ and $R^6$ may represent a nonmetallic atomic group which is capable of forming a heterocyclic ring with each other along with a nitrogen atom to which $R^5$ and $R^6$ are attached respectively; in which $R^9$ represents an alkyl group or an aryl group; and $R^{10}$ and $R^{11}$ are the same or different and each represents a hydrogen atom, an alkyl group or an aryl group;

$R^7$ and $R^8$ are the same or different and each represents a hydrogen atom, a halogen atom, an alkyl group or an alkoxy group;

X and Y are the same or different and each represents a chlorine atom or a bromine atom; and m and n are the same or different and each represents 0, 1 or 2.

4. The photosensitive composition as claimed in claim 3, wherein any of said alkyl groups and said aryl groups representing $R^5$, $R^6$, $R^9$, $R^{10}$ and $R^{11}$ is/are substituted by a substituent selected from the group consisting of an aryl group, a halogen atom, an alkoxy group, a carboxyl group, a carboalkoxy group, a carboaryloxy group, a cyano group, an acetyl group, an acyl group, and a nitro group.

5. The photosensitive composition as claimed in claim 4, wherein said aryl group is a phenyl group, said halogen atom is a chlorine atom, said alkoxy group is selected from the group consisting of a methoxy group and an ethoxy group, said carboalkoxy group is an alkoxycarbonyl group, said carboaryloxy group is an aryloxycarbonyl group, and said acyl group is a benzoyl group.

6. The photosensitive composition as claimed in claim 5, wherein said alkoxycarbonyl group is selected from the group consisting of a carbomethoxy group and a carboethoxy group.

7. The photosensitive composition as claimed in claim 3, wherein any of said alkyl groups and said aryl groups representing $R^5$, $R^6$, $R^9$, $R^{10}$ and $R^{11}$ is/are substituted by a group represented by one of the following formulae:

—SO$_2$—Z$^1$

—SO$_2$—O—Z$^1$

—SO$_2$—NH—Z$^1$ wherein $Z^1$ represents a hydrogen atom, an alkyl group or an aryl group.

8. The photosensitive composition as claimed in claim 3, wherein any of said aryl groups representing $R^5$, $R^6$, $R^9$, $R^{10}$ and $R^{11}$ is/are substituted by an alkyl group.

9. The presensitized plate as claimed in claim 2, wherein the photopolymerization initiator (C) is a photosensitive S-triazine compound represented by the following formula (III):

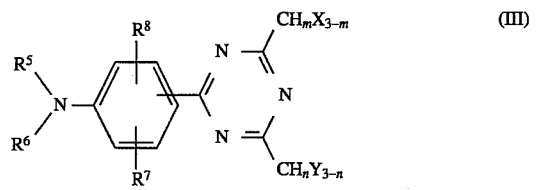

wherein $R^5$ and $R^6$ are the same or different and each represents a hydrogen atom, an alkyl group, an aryl group, —C(=O)$R^9$ or —C(=O)—$NR^{10}$ $R^{11}$, or $R^5$ and $R^6$ may represent a nonmetallic atomic group which is capable of forming a heterocyclic ring with each other along with a nitrogen atom to which $R^5$ and $R^6$ are attached respectively; in which $R^9$ represents an alkyl group or an aryl group; and $R^{10}$ and $R^{11}$ are the same or different and each represents a hydrogen atom, an alkyl group or an aryl group;

$R^7$ and $R^8$ are the same or different and each represents a hydrogen atom, a halogen atom, an alkyl group or an alkoxy group;

X and Y are the same or different and each represents a chlorine atom or a bromine atom; and m and n are the same or different and each represents 0, 1 or 2.

* * * * *